(12) United States Patent
Felder

(10) Patent No.: US 7,321,261 B2
(45) Date of Patent: Jan. 22, 2008

(54) FULL SWING AMPLIFYING CIRCUIT AND APPLICATIONS THEREOF

(75) Inventor: Matthew D. Felder, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 101 days.

(21) Appl. No.: 11/402,189

(22) Filed: Apr. 11, 2006

(65) Prior Publication Data

US 2007/0236285 A1 Oct. 11, 2007

(51) Int. Cl.
*H03F 1/02* (2006.01)

(52) U.S. Cl. .......................................... 330/9; 327/124

(58) Field of Classification Search .................... 330/9, 330/51, 69; 327/124, 307
See application file for complete search history.

(56) References Cited

U.S. PATENT DOCUMENTS

| | | | |
|---|---|---|---|
| 6,380,801 B1 * | 4/2002 | McCartney | 330/9 |
| 6,911,864 B2 * | 6/2005 | Bakker et al. | 330/9 |
| 7,224,216 B2 * | 5/2007 | Thompson et al. | 330/9 |
| 7,233,198 B2 * | 6/2007 | Niederkorn | 330/9 |

* cited by examiner

*Primary Examiner*—Henry Choe
(74) *Attorney, Agent, or Firm*—Garlick Harrison & Markison; Timothy W. Markison

(57) ABSTRACT

An amplifying circuit includes an input chopping circuit, an amplifier, and an output chopping circuit. The input chopping circuit is operably coupled to chop an input signal at a chopping rate to produce a chopped input signal. The amplifier has a first input transistor section, a second input transistor section, and a transistor load section. The first and second input transistor sections are operably coupled to receive the chopped input signal, wherein the first input transistor section amplifies the chopped input signal when the chopped input signal is in first signal level range, the second input transistor section amplifies the chopped input signal when the chopped input signal is in a second signal level range, and the first and second input transistor sections amplify the chopped input signal when the chopped input signal is in a third signal level range, wherein the transistor load section is coupled to the first and second input transistors sections to produce an amplified chopped signal. The output chopping circuit is operably coupled to chop the amplified chopped signal at the chopping rate to produce an amplified output signal.

14 Claims, 7 Drawing Sheets multi-function handheld device 10 amplifying circuit 75

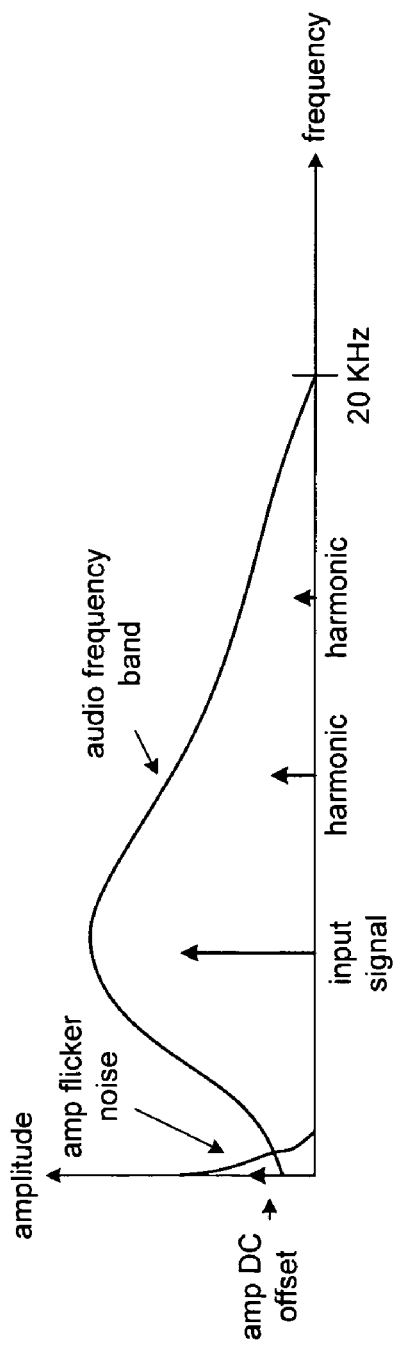
FIG. 7
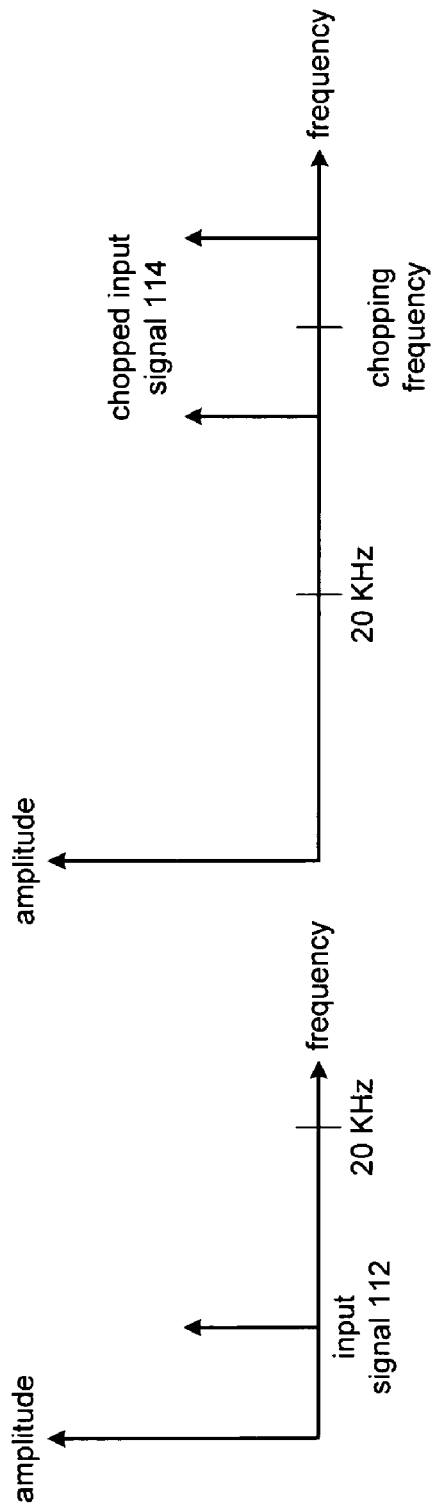
FIG. 9
FIG. 8

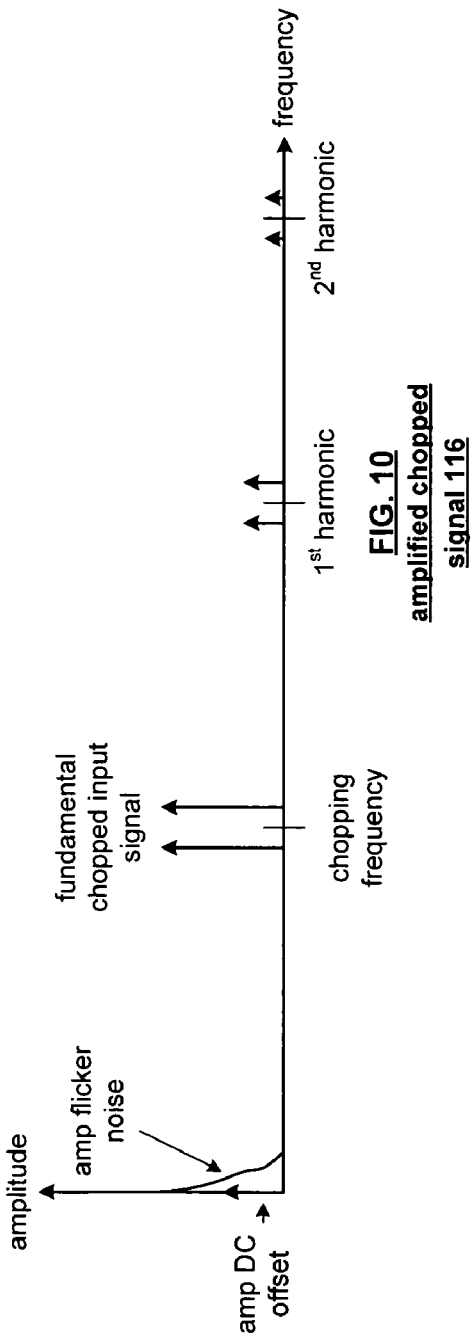
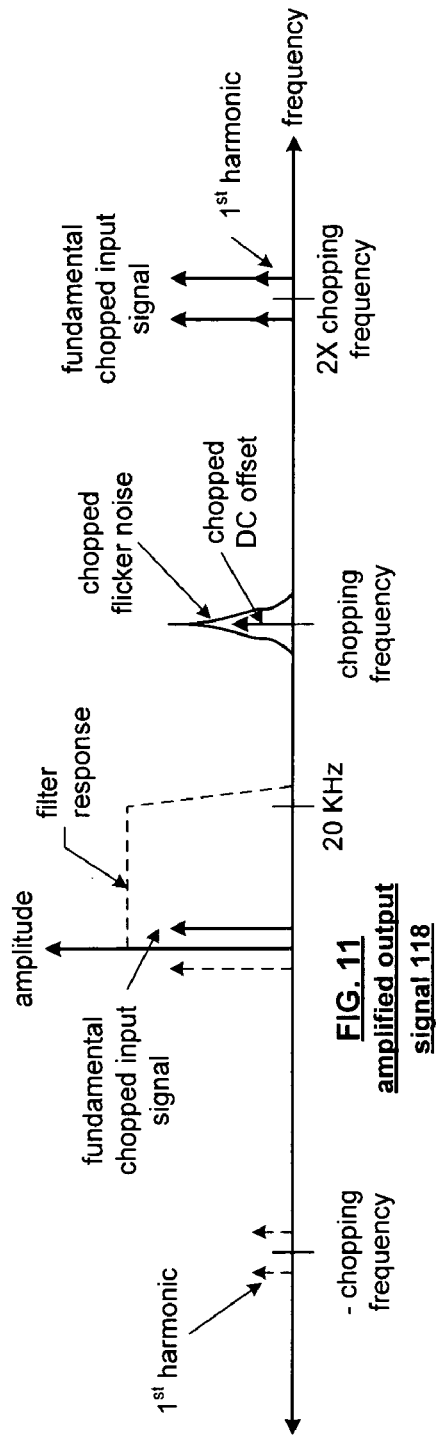

amplifying circuit 75

FULL SWING AMPLIFYING CIRCUIT AND APPLICATIONS THEREOF

STATEMENT REGARDING FEDERALLY SPONSORED RESEARCH OR DEVELOPMENT—NOT APPLICABLE

CROSS REFERENCE TO RELATED PATENTS—NOT APPLICABLE

INCORPORATION-BY-REFERENCE OF MATERIAL SUBMITTED ON A COMPACT DISC—NOT APPLICABLE

BACKGROUND OF THE INVENTION

1. Technical Field of the Invention

This invention relates generally to mixed signal circuitry and more particularly to amplifying circuits.

2. Description of Related Art

Operational amplifiers are used in a wide variety of applications and may be implemented in a variety of ways depending on the application. For instance, a general purpose operational amplifier may be implemented in a single stage consisting of an input transistor pair and a corresponding load. Alternatively, a high end operational amplifier may include multiple stages, where each stage includes a complex implementation to meet impedance requirements, loading requirements, drive requirements, frequency response requirements, rail-to-rail output swing requirements, etc.

When an operational amplifier is implemented using CMOS (complimentary metal oxide semiconductor) technology, it will have some DC (direct current) offset and flicker noise. DC offset is caused by slight mismatches between the components of the operational amplifier, while flicker noise is an inherent low frequency noise produced by CMOS transistors. In general operational amplifier applications, DC offset and flicker noise have negligible effects on the performance of circuitry incorporating the operational amplifier. However, for high end applications, DC offset and flicker noise can adversely affect the desired performance of the operational amplifier and/or of the circuitry in which it is incorporated.

One solution to mitigate the adverse effects of flicker noise and DC offset is to provide a chopping circuit with the operational amplifier. The chopping circuit mixes low frequency energy (e.g., the DC offset, and the flicker noise) to a higher frequency energy that is outside of the frequency band of interest. As such, by moving the DC offset and flicker noise into higher frequency energy, they are out of band and have negligible impact on the performance of the operational amplifier.

In other high end applications, an operational amplifier having an input capable of swinging rail-to-rail (e.g., from a positive rail voltage (e.g., $V_{DD}$) to a negative rail voltage (e.g., ground or $V_{SS}$)) may be required. When input rail-to-rail operational amplifiers are implemented using CMOS technology, they experience a signal dependent offset, which can adversely affect the performance of the operational amplifier and/or the circuitry in which it is incorporated. Such a signal dependent offset results due to slight performance differences of p-channel transistors and n-channel transistors within the input rail-to-rail operational amplifier.

Therefore, a need exists for a full swing amplifying circuit that substantially mitigates the adverse affects of flicker noise, DC offset, and/or signal dependent offset.

BRIEF DESCRIPTION OF THE SEVERAL VIEWS OF THE DRAWING(S)

FIG. 7 is a frequency spectrum graph of an amplifier that may amplify audio signals;

FIG. 8 is a frequency spectrum diagram of an input signal that may be processed by an amplifying circuit in accordance with the present invention;

FIG. 9 is a frequency spectrum diagram of a chopped input signal that may be produced by an amplifying circuit in accordance with the present invention;

FIG. 10 is a frequency spectrum diagram of an amplified chopped signal that may be produced by an amplifying circuit in accordance with the present invention;

FIG. 11 is a frequency spectrum diagram of an amplified output signal that may be produced by an amplifying circuit in accordance with the present invention.

DETAILED DESCRIPTION OF THE DRAWINGS

Figure 1:
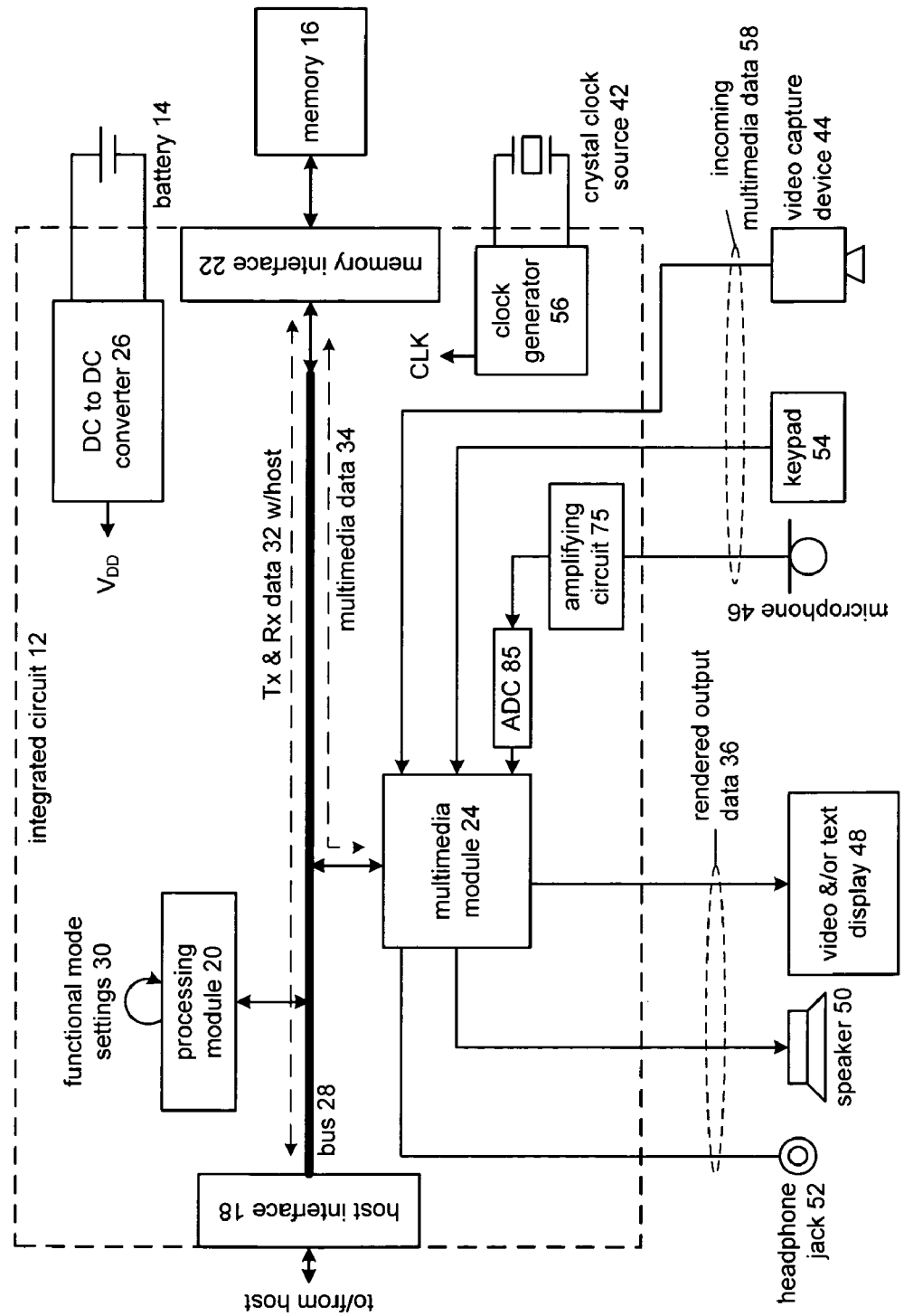
FIG. 1 is a schematic block diagram of a multiple function handheld device in accordance with the present invention.

FIG. 1 is a schematic block diagram of a multi-function handheld device 10 that includes an integrated circuit 12, a battery 14, memory 16, a crystal clock source 42, one or more multimedia input devices (e.g., one or more video capture device(s) 44, keypad(s) 54, microphone(s) 46, etc.), and one or more multimedia output devices (e.g., one or more video and/or text display(s) 48, speaker(s) 50, headphone jack(s) 52, etc.). The integrated circuit 12 includes a host interface 18, a processing module 20, a memory interface 22, a multimedia module 24, a DC-to-DC converter 26, a clock generator 56, which produces a clock signal (CLK) for use by the other modules, an amplifying circuit 75, and an analog to digital converter (ADC) 85. Note that the clock signal CLK may include multiple synchronized clock signals at varying rates for the various operations of the multi-function handheld device. Further note that the DC-to-DC converter 26, which may be constructed in accordance with the teaching of U.S. Pat. No. 6,204,651, entitled METHOD AND APPARATUS FOR REGULATING A DC VOLTAGE, provides at least a first supply voltage to one or more of the host interface 18, the processing module 20, the multimedia module 24, and the memory interface 22. The DC-to-DC converter 26 may also provide $V_{DD}$ to one or more of the other components of the handheld device 10.

When the multi-function handheld device 10 is operably coupled to a host device, which may be a personal computer, workstation, server, a laptop computer, a personal digital assistant, and/or any other device that may transceive data with the multi-function handheld device 10, the processing module 20 performs a functional mode setting algorithm 30 to place the integrated circuit 12 in a first functional mode. The corresponding operational instructions of the algorithm 30 may be stored in memory 16 and/or in memory incorporated in the processing module 20. The processing module 20 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 20 implements one or more of its functions via a state machine, analog circuitry, digital circuitry, and/or logic circuitry, the associated memory storing the corresponding operational instructions is embedded with the circuitry comprising the state machine, analog circuitry, digital circuitry, and/or logic circuitry.

With the multi-function handheld device 10 in the first functional mode, the integrated circuit 12 facilitates the transfer of data between the host device and memory 16, which may be non-volatile memory (e.g., flash memory, disk memory, SDRAM) and/or volatile memory (e.g., DRAM). In this mode, the processing module 30 retrieves a first set of operational instructions (e.g., a file system algorithm) from the memory 16 to coordinate the transfer of data. For example, data received from the host device (e.g., Rx data 32) is first received via the host interface module 18. Depending on the type of coupling between the host device and the handheld device 10, the received data will be formatted in a particular manner. For example, if the handheld device 10 is coupled to the host device via a USB cable, the received data will be in accordance with the format proscribed by the USB specification. The host interface module 18 converts the format of the received data (e.g., USB format) into a desired format by removing overhead data that corresponds to the format of the received data and storing the remaining data as data words. The size of the data words generally corresponds directly to, or a multiple of, the bus width of bus 28 and the word line size (i.e., the size of data stored in a line of memory) of memory 16. Under the control of the processing module 20, the data words are provided via the memory interface 22 to memory 16 for storage. In this mode, the handheld device 10 is functioning as extended memory of the host device (e.g., like a thumb drive).

In furtherance of the first functional mode, the host device may retrieve data (e.g., Tx data 32) from memory 16 as if the memory were part of the computer. Accordingly, the host device provides a read command to the handheld device, which is received via the host interface 18. The host interface 18 converts the read request into a generic format and provides the request to the processing module 20. The processing module 20 interprets the read request and coordinates the retrieval of the requested data from memory 16 via the memory interface 22. The retrieved data (e.g., Tx data) is provided to the host interface 18, which converts the format of the retrieved data from the generic format of the handheld device into the format of the coupling between the handheld device and the host device. The host interface 18 then provides the formatted data to the host device via the coupling.

The coupling between the host device and the handheld device may be a wireless connection or a wired connection. For instance, a wireless connection may be in accordance with Bluetooth, IEEE 802.11(a), (b) or (g), and/or any other wireless LAN (local area network) protocol, IrDA, etc. The wired connection may be in accordance with one or more Ethernet protocols, Firewire, USB, etc. Depending on the particular type of connection, the host interface module 18 includes a corresponding encoder and decoder. For example, when the handheld device 10 is coupled to the host device via a USB cable, the host interface module 18 includes a USB encoder and a USB decoder.

As one of ordinary skill in the art will appreciate, the data stored in memory 16, which may have 64 Mbytes or greater of storage capacity, may be text files, presentation files, user profile information for access to varies computer services (e.g., Internet access, email, etc.), digital audio files (e.g., MP3 files, WMA—Windows Media Architecture-, mp3 PRO, Ogg Vorbis, AAC—Advanced Audio Coding), digital video files [e.g., still images or motion video such as MPEG (motion picture expert group) files, JPEG (joint photographic expert group) files, etc.], address book information, and/or any other type of information that may be stored in a digital format. As one of ordinary skill in the art will further appreciate, when the handheld device 10 is coupled to the host device, the host device may power the handheld device 10 such that the battery is unused.

When the handheld device 10 is not coupled to the host device, the processing module 20 executes the function mode setting algorithm 30 to detect the disconnection and to place the handheld device in a second operational mode. In the second operational mode, the processing module 20 retrieves, and subsequently executes, a second set of operational instructions from memory 16 to support the second operational mode. For example, the second operational mode may correspond to MP3 file playback, digital dictaphone recording, MPEG file playback, JPEG file playback, text messaging display, cellular telephone functionality, and/or AM/FM radio reception. Each of these functions is known in the art, thus no further discussion of the particular implementation of these functions will be provided except to further illustrate the concepts of the present invention.

In the second operational mode, under the control of the processing module 20 executing the second set of operational instructions, the multimedia module 24 retrieves multimedia data 34 from memory 16. The multimedia data 34 includes at least one of digitized audio data, digital video data, and text data. Upon retrieval of the multimedia data, the multimedia module 24 converts the data 34 into rendered output data 36. For example, the multimedia module 24 may convert digitized data into analog signals that are subsequently rendered audible via a speaker 50 or via a headphone jack 52. In addition, or in the alternative, the multimedia module 24 may render digital video data and/or digital text data into RGB (red-green-blue), YUV, etc., data for display 48 on an LCD (liquid crystal display) monitor, projection CRT, and/or on a plasma type display.

As one of ordinary skill in the art, the handheld device 10 may be packaged similarly to a thumb drive, a cellular telephone, pager (e.g., text messaging), a PDA, an MP3 player, a radio, and/or a digital dictaphone and offer the corresponding functions of multiple ones of the handheld devices (e.g., provide a combination of a thumb drive and MP3 player/recorder, a combination of a thumb drive, MP3 player/recorder, and a radio, a combination of a thumb drive, MP3 player/recorder, and a digital dictaphone, combination of a thumb drive, MP3 player/recorder, radio, digital dictaphone, and cellular telephone, etc.).

In addition, the handheld device 10 may store digital information received via one of the multimedia input devices 44, 46, and 54. For example, a voice recording received (e.g., audio signal) via the microphone 46 and amplifying circuit 75, which will be described in greater detail with reference to FIGS. 2-13, may be provided to the ADC 85. The ADC 85 converts the amplified audio signal into a digital audio signal that is provided as multimedia input data 58 to the multimedia module 24. Similarly, video recordings may be captured via the video capture device 44 (e.g., a digital camera, a camcorder, VCR output, DVD output, etc.) and processed by the multimedia module 24 for storage as digital video data in memory 16. Further, the key pad 54 (which may be a keyboard, touch screen interface, or other mechanism for inputting text information) provides text data to the multimedia module 24 for storage as digital text data in memory 16. In this mode, the processing module 20 arbitrates write access to the memory 16 among the various input sources (e.g., the host and the multimedia module).

Figure 2:
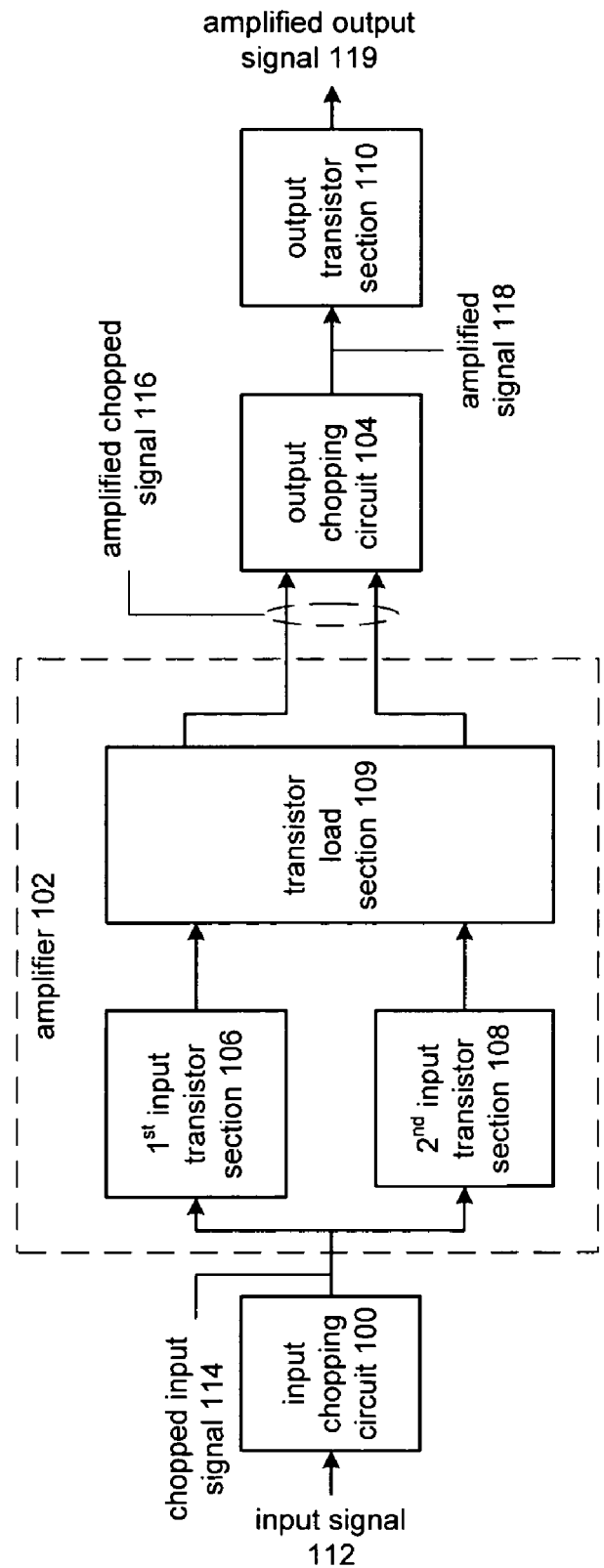
FIG. 2 is a schematic block diagram of an amplifying circuit in accordance with the present invention.

FIG. 2 is a schematic block diagram of an amplifying circuit 75 that may be used within the multiple function handheld device 10 of FIG. 1 or in a multitude of other applications requiring amplification of an analog signal. The amplifying circuit 75 includes an input chopping circuit 100, an amplifier 102, an output chopping circuit 104, and may further include an output transistor section 110. The amplifier 102 includes a $1^{st}$ input transistor section 106, a $2^{nd}$ input transistor section 108, and a transistor load section 109.

In operation, the input chopping circuit 100 receives an input signal 112, which may be a single-ended or differential audio signal received via microphone 46, and produces therefrom a chopped input signal 114. In general, the input chopping circuit 100 mixes the input signal 112 with a chopping signal to produce a higher frequency rate signal. This will be described in greater detail with reference to FIGS. 4-12. In other words, the input chopping circuit chops the input signal at a chopping rate to produce the chopped input signal 114.

The $1^{st}$ and $2^{nd}$ input transistor sections 106 and 108 of amplifier 102 receive the chopped input signal 114. The $1^{st}$ input transistor section 106 amplifies the chopped input signal 114 when it is in a $1^{st}$ signal level range. The $2^{nd}$ input transistor section 108 amplifies the chopped input signal 114 when it is in a $2^{nd}$ signal level range. Both the $1^{st}$ and $2^{nd}$ input transistor sections amplify the chopped input signal 114 when it is in a $3^{rd}$ signal level range. The functioning of the $1^{st}$ and $2^{nd}$ input transistor sections 106 and 108 will be described in greater detail with reference to FIGS. 4-12.

The transistor load section 109 receives the outputs of the $1^{st}$ and $2^{nd}$ input transistor sections 106 and 108 and produces, therefrom, an amplified chopped signal 116. The functioning of the transistor load section 109 will be discussed in greater detail with reference to FIGS. 4-12.

The output chopping circuit 104 receives the amplified chopped signal 116 and chops it at the chopping rate to produce an amplified signal 118. In general, the output chopping circuit 104 mixes the amplified chopped signal 116 with a signal having a frequency corresponding to the chopping rate to produce the amplified signal 118. The functionality of the output chopping circuit 104 will be described in greater detail with reference to FIGS. 4-12.

The output transistor section 110 receives the amplified signal 118 and further amplifies it to produce an amplified output signal 119. The functionality of the output transistor section 110 will be described in greater detail with reference to FIG. 12.

As one of ordinary skill in the art will appreciate, the amplified chopped signal 116 may be a single-ended or differential signal. In addition, the amplified output signal 118 may be a single-ended or differential signal and, when the amplifying circuit is incorporated in integrated circuit 12, is provided to the ADC 85. Note that by including the multiple input transistor sections, the amplifier 102 is allowed to accept a rail-to-rail input voltage wherein the signal dependent input offset inherent with using multiple input transistor sections is shifted to higher frequencies and thus, is negligible and/or may be filtered to further reduces its affect on the amplifying circuit 75.

Figure 3:
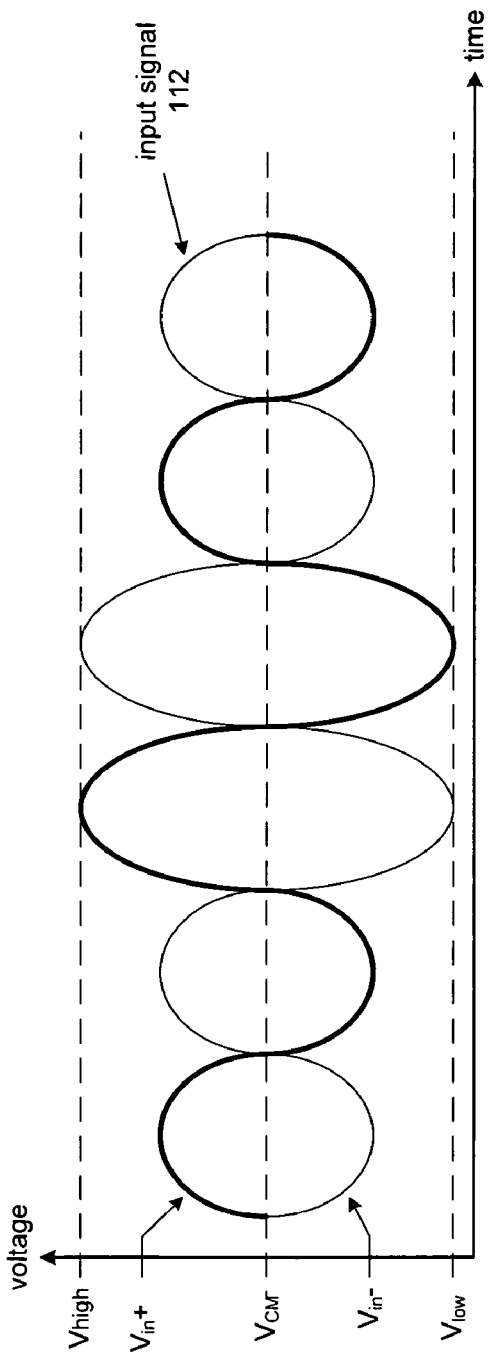
FIG. 3 is a graph of an input signal that may be processed by an amplifying circuit in accordance with the present invention.

FIG. 3 is a graph of an example of an input signal 112 that may be a differential signal. As shown, the input signal 112 includes a positive leg ($V_{in}$+) and a negative leg ($V_{in}$−). The positive leg is illustrated by a thicker line than the negative leg. The input signal is shown as a tone signal but may be any audio signal that includes one or more sinusoidal components. In this example, the input signal may range from a low value ($V_{low}$) to a high voltage value ($V_{high}$). The signal is centered about a common mode voltage ($V_{cm}$). Note that a single-ended input signal 112 may be represented by the positive leg or the negative leg.

Figure 4:
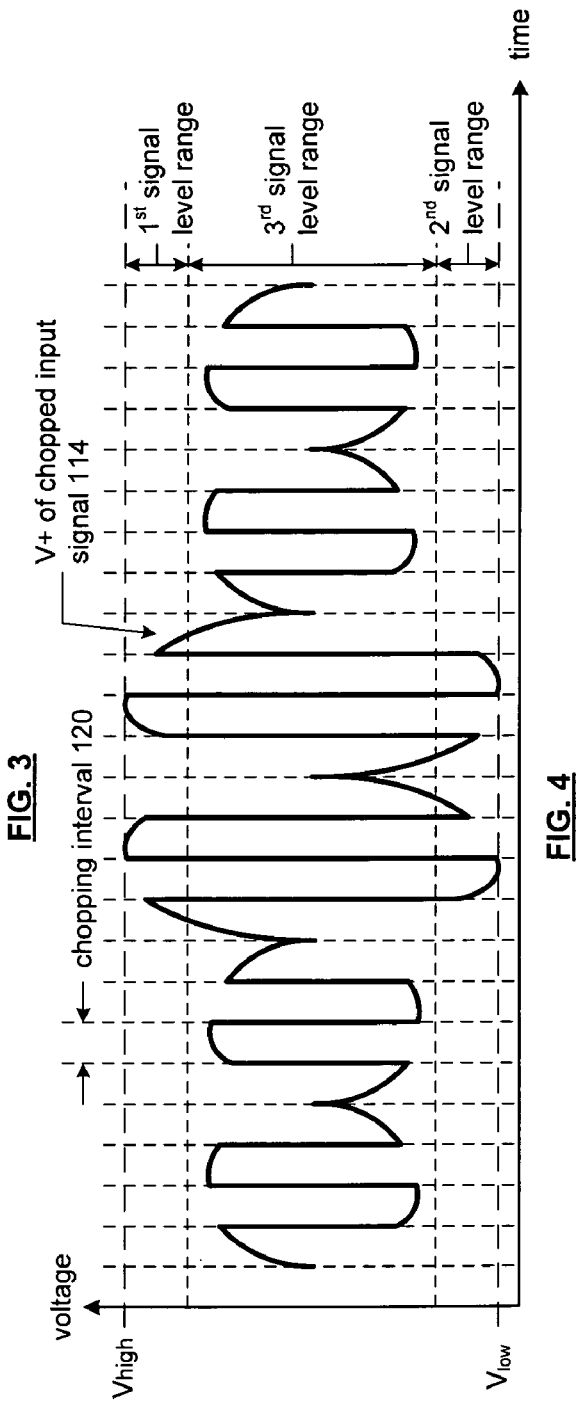
FIGS. 4-6 are graphs illustrating an example of an amplifying circuit processing the input signal of FIG. 3 in accordance with the present invention.
Figure 5:
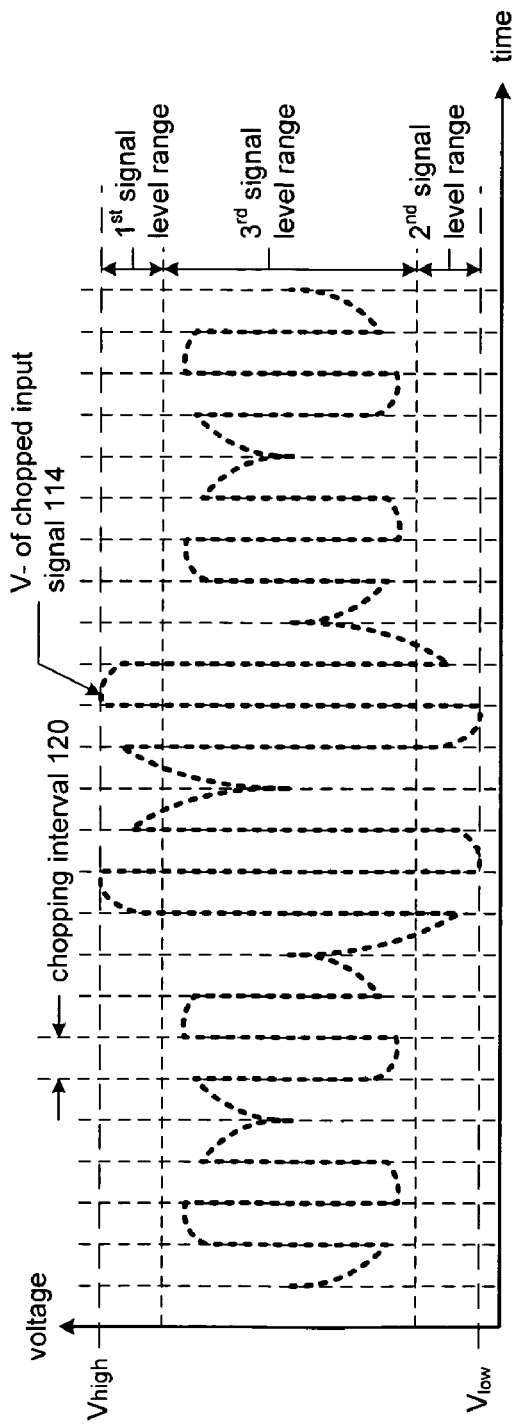

FIGS. 4 and 5 illustrate the chopped input signal 114 produced by the input chopping module 100 with respect to input signal 112. FIG. 4 illustrates the positive leg (V+) of the chopped input signal 114 and FIG. 5 illustrates the negative leg (V−) of the chopped input signal 114. To produce such a signal, the input chopping module 100 mixes the input signal 112 with a signal having a chopping frequency corresponding to one over the period of a chopping interval 120. Note that the chopping interval 120 may be chosen for a particular chopping frequency from one of a plurality of chopping frequencies. For example, the chopping frequency may be 48 KHz, 96 KHz, 192 KHz, et cetera. In general, the chopping frequency should be at least twice the maximum frequency of the input signal 112. Thus, for an audio signal, which may range from a few hertz to 20 KHz, the chopping frequency should be at least 40 KHz (e.g., 2*20 KHz). Note that for a single-ended input signal 112, the input chopped signal 114 would be represented by either FIG. 4 or FIG. 5.

In this example, the positive leg (V+) of the chopped input signal 114 corresponds to the positive leg ($V_{in}$+) of the input signal 112 modulated with a +1, −1 pulse train having a frequency corresponding to the chopping frequency. As such, the resulting signal for each chopping interval corresponds to +1 times the positive leg of the input signal followed by a −1 times the positive leg of the input signal and alternating there between for the duration of the input signal.

As is further shown, the voltage magnitude of the chopped input signal 114 is divided into three signal level ranges. The $1^{st}$ signal level range corresponds to a range between a threshold voltage and a high voltage ($V_{high}$). In one embodiment, the high voltage corresponds to a maximum allowable input voltage for the amplifier circuit. The threshold voltage of the $1^{st}$ signal level range corresponds to a voltage at which the $2^{nd}$ input transistor section 108 is essentially non-functional. For instance, if the $2^{nd}$ input transistor section includes P-channel transistors, the lower threshold of the $1^{st}$ signal level range corresponds to the voltage threshold of the P-channel transistor. This will be described in greater detail with reference to FIG. 12.

The $2^{nd}$ signal level range is within a range of the low voltage ($V_{low}$) and another threshold voltage. In this example, the low voltage corresponds to a minimum value of the input signal. The threshold voltage of the $2^{nd}$ signal level range corresponds to when the $1^{st}$ transistor section of the amplifier 102 is essentially non-functional. For example, if the 1st input transistor section 106 includes N-channel transistors, the threshold would correspond to the voltage threshold of the gate source voltage of the N-channel transistors. This will be described in greater detail with reference to FIG. 12.

The 3rd signal level range corresponds to the voltage range between the 1st and 2nd signal level ranges. In this range, both the 1st and 2nd input transistor sections 106 and 108 are operable to amplify the chopped input signal 114.

In FIG. 5, the negative leg ($V_{in}-$) of the chopped input signal 114 is produced by mixing the input signal 112 with a +1, −1 signal having a frequency corresponding to the chopping frequency. Recall that the chopping frequency corresponds to one over the period of the chopping interval 120. The signal level ranges for the negative leg of the chopping input signal 113 are also shown in FIG. 5.

With reference to FIG. 2 and assuming the input signal 112 is differential, the amplifier 102 amplifies the positive leg and negative leg of the chopped input signal 114 via the 1st and 2nd input transistor sections 106 and 108 and the load transistor section 109 produces an amplified chopped signal 116 therefrom. Graphically, the amplified chopped signal 116 would look similar to the chopped input signal 114 but with a different magnitude. For example, the magnitude range may be from a negative voltage reference (e.g., ground or $V_{SS}$) to a positive voltage rail (e.g., $V_{DD}$).

Figure 6:
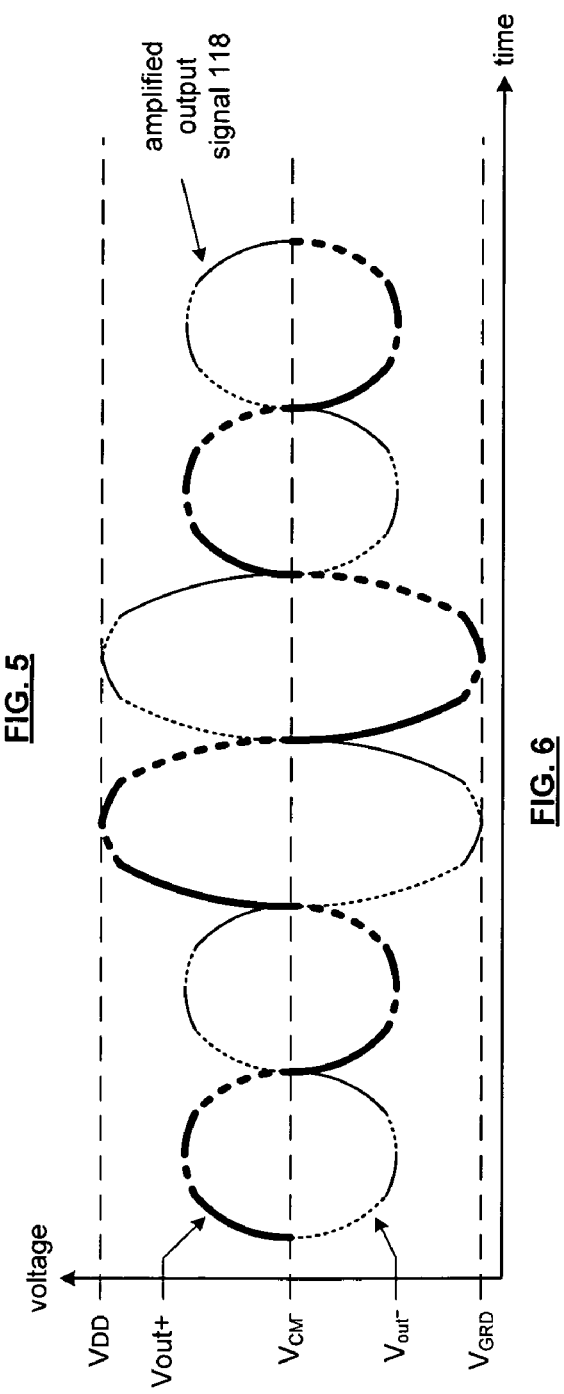

FIG. 6 is a graph of an example of the amplified output signal 118 as produced by the output chopping circuit 104. The output chopping circuit 104 receives the amplified chopped signal 116 and mixes it with a chopping signal having a chopping frequency to produce the desired amplified output signal 118.

In the illustration of FIG. 6, the thicker line corresponds to the positive leg of the amplified output signal 118 and the thinner line corresponds to the negative leg of the amplified output signal 118. The solid line of the + and − legs of the amplified output signal 118 correspond to the times +1 mixing of the amplified chopped signal 116 with the chopping signal and the dashed lines correspond with the −1 mixing of the amplified chopped signal 116 with the chopping signal.

FIG. 7 illustrates a frequency spectrum diagram of an audio frequency band ranging from 0 to 20 KHz and the amplification of an input signal utilizing a rail-to-rail operational amplifier that does not include the input or output chopping modules 100 and 104. Accordingly, the diagram of FIG. 7 would correspond to the input signal 112 being directly applied to the input of amplifier 102.

As shown, the amplifier produces harmonics when amplifying the input signal, which are signal dependent and result due to differing transfer characteristics and/or operational characteristics of the N-channel transistors and P-channel transistors within the amplifier 102. In addition, the amplifier generates flicker noise at low frequencies and may further generate a DC offset. Thus, if the amplifier 102, without the input and output chopping modules 100 and 104 were utilized in a high performance audio application, the adverse effects of the harmonics, DC offset, and/or flicker noise would most likely adverse effect the performance and thus yield a less than desired circuit.

FIGS. 8-11 illustrate frequency spectrum diagrams of the processing of the input signal by the amplifying circuit 75. FIG. 8 illustrates the frequency spectrum of the input signal 112 as it is received by the input chopping module 100. In this instance, the input signal 112 is a tone centered at a particular frequency. As one of ordinary skill in the art will appreciate, the input signal 112 may be an audio signal that includes a multitude of sinusoidal components wherein the frequency spectrum of the input signal would consume at least a portion of the 20 KHz frequency spectrum.

FIG. 9 illustrates the frequency spectrum of the chopped input signal 114 that is produced by the input chopping circuit 100 as it mixes a chopping signal having a chopping frequency with the input signal 112. The chopping frequency should be at least twice as great as the audio frequency spectrum band of 20 KHz. In this example, the chopping signal is represented as a sinusoidal signal but may be a +1, −1 pulse train at the chopping frequency. The chopping signal 114, which is the mixing of the input signal 114 with the chopping signal, produces two signal components, one at a frequency corresponding to the sum of the chopping frequency with the frequency of the input signal and the other corresponding to the chopping frequency minus the frequency of the input signal.

FIG. 10 illustrates the frequency spectrum of the amplified chopped signal 116 at the output of the amplifier 102. In this instance, the amplifier produces flicker noise and a DC offset at or near 0 hertz. The chopped input signal 114 is amplified and shown as the fundamental chopped input signal. The amplifier produces harmonics of the fundamental chopped input signal at multiples of the chopping frequency as shown. For example, if the input signal has a frequency of 1 KHz and the chopping frequency is 48 KHz, the fundamental chopped input signal will have a component at 47 KHz (i.e., 48−1) and at 49 KHz (i.e., 48+1). The harmonics will be at 2×, 3×, et cetera of these frequency components of the fundamental chopped input signal.

FIG. 11 illustrates the frequency spectrum diagram of the amplified output signal 118 at the output of the output chopping module 104. As previously discussed, the output chopping module mixes the amplified chopped signal 116 with the chopping signal to produce the amplified output signal 118. In this example, the chopping signal is assumed to be sinusoidal but may in practice be a pulse train or a functional pulse train as will be illustrated in FIG. 12.

By mixing the amplified chopped signal 116 with the chopping signal the resulting amplified output signal 118 includes a signal component based on the sums of the frequency of the chopping signal and the amplified chopped signal 116 and the difference between the frequencies. For example, continuing with the example of a 48 KHz chopping signal, the resulting signal components are at 1 KHz (i.e., 48−47), at −1 KHz (i.e., 48−49), at 95 KHz (i.e., 48+47), and at 97 KHz (i.e., 48+49). The signal components of the 1st harmonic are at −47 KHz (i.e., 48−95), at −49 KHz (i.e., 48−97), at 143 KHz (i.e., 48+95), and at 145 KHz (i.e., 48+97).

Within an appropriate filter response that embodies the 20 KHz audio frequency band, the only component of the amplified chopped signal 116 within the 20 KHz frequency band is the fundamental chopped input signal. In the example provided, the fundamental chopped input signal is at 1 KHz. All other components are filtered out. Thus, the amplifying circuit substantially filters flicker noise, DC offset and signal dependent noise for rail-to-rail amplifiers.

Figure 12:
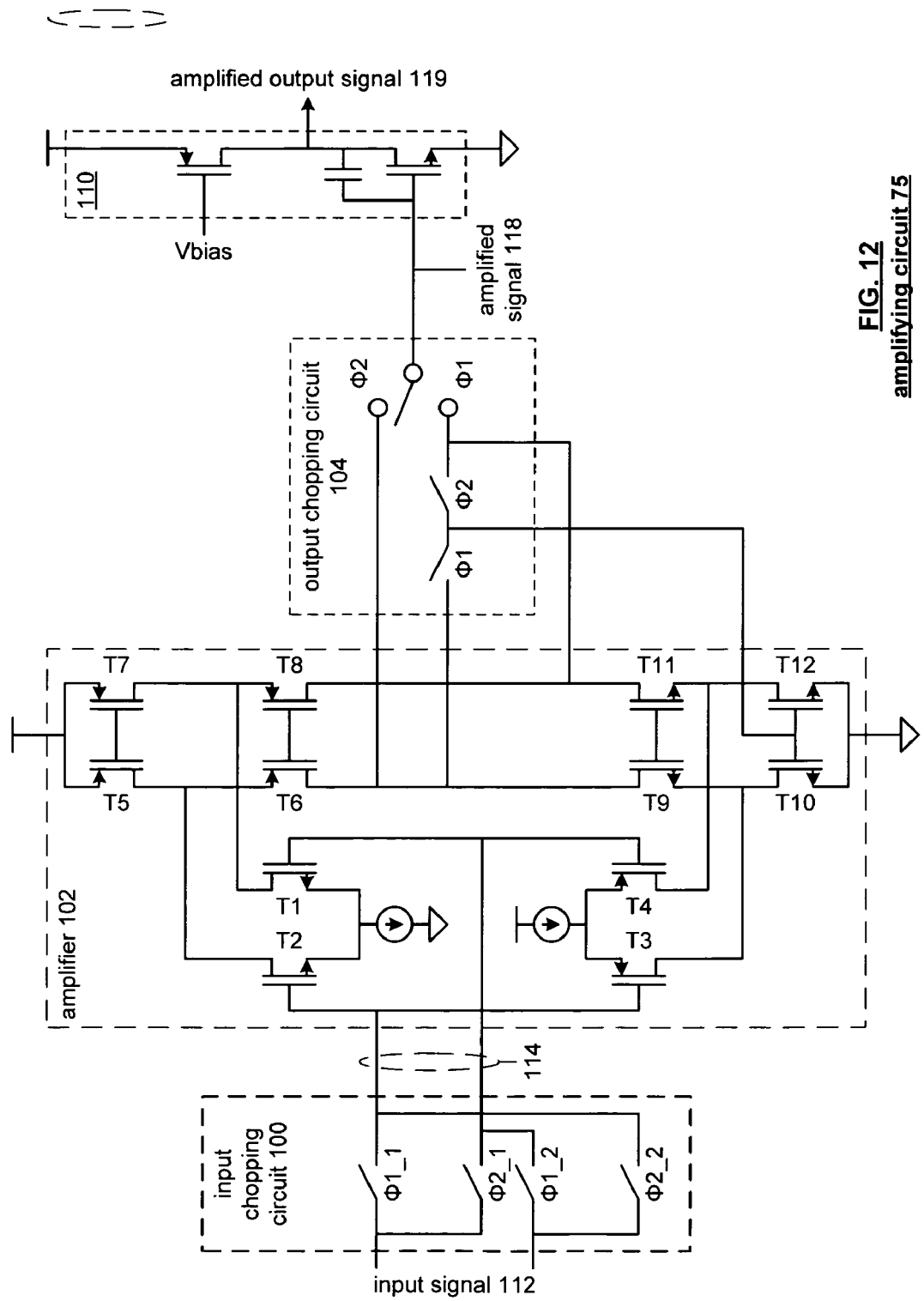
FIG. 12 is a schematic block diagram of an embodiment of an amplifying circuit in accordance with the present invention.

FIG. 12 is a schematic block diagram of an embodiment of amplifying circuit 75 that includes the input chopping circuit 100, amplifier 102, output chopping circuit 104, and the output transistor section 110. The input chopping circuit 100 includes a 1st and 2nd input chopping modules. The 1st input chopping module may include switch ϕ1_1 coupled to the positive leg of the input signal 112 and switch ϕ1_2 coupled to the negative leg of the input signal 112. The 2nd input chopping module may include switch ϕ2_2 coupled to the negative leg of the input signal 112 and switch φ2_1 coupled to the positive leg of the input signal 112.

The amplifier 102 includes the $1^{st}$ and $2^{nd}$ input transistor sections 106 and 108 and the transistor load section 109. The $1^{st}$ and $2^{nd}$ input transistor sections 106 and 108 comprise transistors T1-T4 and the associated current sources. The transistor load section 109 includes transistors T5-T12.

The output chopping circuit 104 includes a $1^{st}$ output chopping module as represented by Φ1 switching function and a $2^{nd}$ output chopping module as represented by Φ2 switching function. The output transistor section 110 includes a Miller compensated output stage.

The $1^{st}$ and $2^{nd}$ input chopping modules effectively perform the mixing of the input signal 112 with a chopping signal to produce the chopped input signal 114. By alternating during a $1^{st}$ phase (φ1), and a $2^{nd}$ phase (φ2) of a chopping interval (i.e., one over the chopping frequency), the $1^{st}$ plurality coupling is achieved. For example, during phase 1 of a chopping interval, the input signal 112 is coupled to an input of amplifier 102 in a first phase polarity (e.g., 0° phase shift). During the $2^{nd}$ phase of the chopping interval, the input signal 112 is coupled to another input of the amplifier 102 in a second phase polarity (e.g., 180° phase shift). Thus, the alternating of 0° phase shift and 180° phase shift of the input signal 112 to the inputs of the amplifier 102 produce the chopped input signal 114 at a rate corresponding to the chopping frequency.

The amplifier 102 functions in three modes based on the level of the chopped input signal 114. For example, when the chopped input signal is in first signal level range (e.g., near $V_{DD}$), the n-channel transistors T1 and T2 (e.g., the first input transistor section), in combination with the transistors T5-T12 of the transistor load section amplify the chopped input signal 114, to produce the amplified chopped signal 116.

As another example, when the chopped input signal is in a second signal level range (e.g., near ground), the p-channel transistors T3 and T4 (e.g., the second input transistor section) amplify the chopped input signal in combination with the load transistor section T5-T12 to produce an amplified chopped signal 116. As yet another example, when the chopped input signal is in a third range (e.g., between near $V_{DD}$ and near ground), transistors T1-T4 amplify the chopped input signal 114 in combination with transistors T5-T12 to produce the amplified chopped signal 116.

The $1^{st}$ and $2^{nd}$ output chopping modules of the output chopping circuit 104 include switching elements that alternate the amplifier output coupling to produce the amplified signal 118 at a rate corresponding to the chopping frequency. As such, the alternate switching of the $1^{st}$ and $2^{nd}$ output chopping modules functions as a mixing of the amplifier output 116 with a mixing signal having a frequency corresponding to the chopping frequency. While not shown in FIG. 12, the amplified output signal 118 may be filtered utilizing a filter response as illustrated in FIG. 11 if desired.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "operably associated with", as may be used herein, includes direct and/or indirect coupling of separate components and/or one component being embedded within another component. As one of ordinary skill in the art will still further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The preceding discussion has presented a full swing amplifier circuit and applications thereof that substantially reduce flicker noise, DC offset and/or signal dependent noise. As one of average skill in the art will appreciate, other embodiments may be derived from the teachings of the present invention without deviating from the scope of the claims. For example, a PFET common emitter output stage may be used instead of an NFET output stage. As another example, current mirroring on the PFET side of the folded cascode load may be used.

What is claimed is:

1. An amplifying circuit comprises:
    an input chopping circuit operably coupled to chop an input signal at a chopping rate to produce a chopped input signal;
    an amplifier having a first input transistor section, a second input transistor section, and a transistor load section, wherein the first and second input transistor sections are operably coupled to receive the chopped input signal, wherein the first input transistor section amplifies the chopped input signal when the chopped input signal is in first signal level range, the second input transistor section amplifies the chopped input signal when the chopped input signal is in a second signal level range, and the first and second input transistor sections amplify the chopped input signal when the chopped input signal is in a third signal level range, wherein the transistor load section is coupled to the first and second input transistors sections to produce an amplified chopped signal; and
    an output chopping circuit operably coupled to chop the amplified chopped signal at the chopping rate to produce an amplified signal.

2. The amplifying circuit of claim 1, wherein the input chopping circuit comprises:
- a first input chopping module operably coupled to provide a first polarity of the input signal during a first portion of a time interval having a period corresponding to the chopping rate; and
- a second input chopping module operably coupled to provide a second polarity of the input signal during a second portion of the time interval, wherein the first and second polarities of the input signal correspond to a period of the chopped input signal.

3. The amplifying circuit of claim 1, wherein the output chopping circuit comprises:
- a first output chopping module operably coupled to provide a first polarity of the amplified chopped signal during a first portion of a time interval having a period corresponding to the chopping rate; and
- a second output chopping module operably coupled to provide a second polarity of the amplified chopped signal during a second portion of the time interval, wherein the first and second polarities of the amplified chopped signal correspond to a period of the amplified output signal.

4. The amplifying circuit of claim 1, wherein the amplified signal comprises a single ended amplified signal.

5. The amplifying circuit of claim 4, wherein the output chopping circuit comprises:
- a first output switch operably coupled to provide a first leg of the amplified chopped signal during a first portion of a time interval having a period corresponding to the chopping rate; and
- a second output switch operably coupled to provide a second leg of the amplified chopped signal during a second portion of the time interval, wherein the first and second legs of the amplified chopped signal correspond to a period of the single ended amplified signal.

6. The amplifying circuit of claim 1, wherein the chopping frequency comprises one of a plurality of chopping frequencies, wherein the one of the plurality of chopping frequencies is selected as the chopping frequency.

7. The amplifying circuit of claim 1 comprises:
- the first input transistor section including:
  - a first transistor;
  - a second transistor;
  - a first current source operably coupled to the first and second transistors, wherein the first and second transistors receive the input signal;
- the second input transistor section including:
  - a third transistor;
  - a fourth transistor;
  - a second current source operably coupled to the third and fourth transistors, wherein the third and fourth transistors receive the input signal;
- an output transistor section operably coupled to amplify the amplified signal to produce an amplified output signal.

8. An audio processing integrated circuit comprises:
- a microphone input operably coupled to receive an audio input signal;
- an amplifying circuit operably coupled to amplifying the audio input signal to produce an amplified audio signal, wherein the amplifying circuit includes:
  - an input chopping circuit operably coupled to chop the audio input signal at a chopping rate to produce a chopped input signal;
  - an amplifier having a first input transistor section, a second input transistor section, and a transistor load section, wherein the first and second input transistor sections are operably coupled to receive the chopped input signal, wherein the first input transistor section amplifies the chopped input signal when the chopped input signal is in first signal level range, the second input transistor section amplifies the chopped input signal when the chopped input signal is in a second signal level range, and the first and second input transistor sections amplify the chopped input signal when the chopped input signal is in a third signal level range, wherein the transistor load section is coupled to the first and second input transistors sections to produce an amplified chopped signal; and
  - an output chopping circuit operably coupled to chop the amplified chopped signal at the chopping rate to produce the amplified audio signal;
- an analog to digital converter operably coupled to convert the amplified audio signal into a digital audio signal; and
- audio processing module operably coupled to process the digital audio signal.

9. The audio processing integrated circuit of claim 8, wherein the input chopping circuit comprises:
- a first input chopping module operably coupled to provide a first polarity of the audio input signal during a first portion of a time interval having a period corresponding to the chopping rate; and
- a second input chopping module operably coupled to provide a second polarity of the audio input signal during a second portion of the time interval, wherein the first and second polarities of the input signal correspond to a period of the chopped input signal.

10. The audio processing integrated circuit of claim 8, wherein the output chopping circuit comprises:
- a first output chopping module operably coupled to provide a first polarity of the amplified chopped signal during a first portion of a time interval having a period corresponding to the chopping rate; and
- a second output chopping module operably coupled to provide a second polarity of the amplified chopped signal during a second portion of the time interval, wherein the first and second polarities of the amplified chopped signal correspond to a period of the amplified audio signal.

11. The audio processing integrated circuit of claim 8, wherein the amplified audio signal comprises a single ended amplified audio signal.

12. The audio processing integrated circuit of claim 11, wherein the output chopping circuit comprises:
- a first output switch operably coupled to provide a first leg of the amplified chopped signal during a first portion of a time interval having a period corresponding to the chopping rate; and
- a second output switch operably coupled to provide a second leg of the amplified chopped signal during a second portion of the time interval, wherein the first and second legs of the amplified chopped signal correspond to a period of the single ended amplified audio signal.

13. The audio processing integrated circuit of claim 8, wherein the chopping frequency comprises one of a plurality of chopping frequencies, wherein the one of the plurality of chopping frequencies is selected as the chopping frequency.

14. The audio processing integrated circuit of claim 8 comprises:
the first input transistor section including:
a first transistor;
a second transistor;
a first current source operably coupled to the first and second transistors, wherein the first and second transistors receive the audio input signal;
the second input transistor section including:
a third transistor;
a fourth transistor;
a second current source operably coupled to the third and fourth transistors, wherein the third and fourth transistors receive the audio input signal;
an output transistor section operably coupled to further amplify the amplified audio signal to produce an output amplified audio signal.

* * * * *